United States Patent [19]
Helms et al.

[11] Patent Number: 5,491,450
[45] Date of Patent: Feb. 13, 1996

[54] LOW POWER CONSUMPTION PROCESS-INSENSITIVE FEEDBACK AMPLIFIER

[75] Inventors: David R. Helms; Michael J. Fithian, both of Liverpool, N.Y.

[73] Assignee: Martin Marietta Corporation, Syracuse, N.Y.

[21] Appl. No.: 69,869

[22] Filed: Jun. 1, 1993

[51] Int. Cl.⁶ .................................................. H03F 1/34
[52] U.S. Cl. ......................... 330/277; 330/282; 330/294
[58] Field of Search ............................... 330/86–88, 277, 330/282, 293, 294

[56] References Cited

U.S. PATENT DOCUMENTS

| | | | |
|---|---|---|---|
| 5,015,968 | 5/1991 | Podell et al. | 330/277 |
| 5,068,624 | 11/1991 | Taneichi et al. | 330/88 X |
| 5,208,547 | 5/1993 | Schindler | 330/277 X |

*Primary Examiner*—James B. Mullins
*Attorney, Agent, or Firm*—Paul Checkovich; Stephen A. Young

[57] ABSTRACT

A low power consumption amplifier that is essentially insensitive to the process used to fabricate the active devices of the amplifier employs feedback to minimize variations in electrical characteristics of the devices. For weight-sensitive microwave applications, a high electron mobility transistor (HEMT) or a pseudomorphic high electron mobility transistor (PHEMT) may be selected as an active device for each stage of the amplifier. HEMTs and PHEMTs typically exhibit greater device gain than do MESFETs, especially at the upper portion of X-band and above, so that a HEMT- or PHEMT-based stage of an amplifier where additional overall gain is required, can be achieved without significantly adversely affecting power consumption demands, and attendant electrical energy storage/generation requirements while achieving and/or maintaining an overall flat gain characteristic of the amplifier.

14 Claims, 2 Drawing Sheets

LOW POWER CONSUMPTION PROCESS-INSENSITIVE FEEDBACK AMPLIFIER

BACKGROUND OF THE INVENTION

This invention relates to amplifiers, and, more specifically, to an amplifier having a flat output characteristic that uses a HEMT (High Electron Mobility Transistor) and/or PHEMT (Pseudomorphic High Electron Mobility Transistor) with feedback circuitry having low electrical input power requirements and suitable for operation at microwave frequencies and above. Such an amplifier is particularly suited to space-borne applications, such as satellites, where weight concerns are generally paramount. Microwave frequencies are generally designated to be in the range from about 1 GHz to about 30 GHz while millimeter-wave frequencies are generally considered to lie in the band from about 30 GHz to about 300 GHz.

In weight sensitive environments, like air-borne and space-borne applications, a significant portion of the overall weight being carried is due to the electronic systems and other items on board that are used to support operation of the electronic systems. For example, in a satellite, batteries or other energy storage medium or combination thereof is required to supply electrical power to the electronics on demand. Further, inasmuch as it is not practical to store large amounts of power because of the number of storage devices and the attendant extra weight required, a regenerator, such as solar cells arranged in a solar panel, may be used to recharge the storage system.

The rate at which the electronics demand electrical power will determine the rate at which the storage system will need to be recharged. In the case of solar cells, the rate of recharging is directly proportional to the number of solar cells, with increasing rates demanding more cells which ultimately determines the size of the solar panels required to hold the cells. As the number of cells increases, the size of the panel and its attendant weight also increase.

The necessity to provide required electrical power to the electronics may also be addressed by appropriate selection of the amount and type of energy storage media to be used. As the number of batteries for storing energy increases, the electrical power available increases but so does the total weight of the energy storage system.

One reason there is such concern about weight with regard to a satellite is that typically satellites are delivered from earth, or from an air-borne or space-borne platform, by a delivery system, like a rocket, which uses thrust engines to provide the desired trajectory for the delivery system and ultimately the satellite. The amount of thrust, and therefore the size of the engines required, is directly proportional to the overall weight of the delivery apparatus which includes the weight of the payload, or satellite. The cost of providing larger or more engines for obtaining additional thrust, increases faster than a straight-line relationship with respect to overall weight, and may even approach or exceed an exponential relationship between cost and available thrust. This relationship may be especially pernicious when applied to the cost to obtain an increase in the marginal thrust beyond some threshold reference.

Previous electronic amplifiers have employed, MESFETs (Metal Semiconductor Field Effect Transistor) as active elements. However, use of MESFETs with feedback has been generally limited for weight sensitive environments to frequencies in the lower portion of the X-band (8–12 GHz) and below, due to inadequate or insufficient individual MESFET device gain.

An article entitled "Ultra-Flat Low-Power Process Insensitive Ku-Band HEMT Feedback MMIC" by D. R. Helms and M. J. Fithian, named inventors hereof, was published in the Proceedings of the IEEE Microwave and Millimeter-Wave Monolithic Circuits Symposium having a date of Jun. 1, 1992 and is hereby incorporated in its entirety by reference thereto.

SUMMARY OF THE INVENTION

In accordance with the present invention, an amplifier comprises a high electron mobility transistor (HEMT) or a pseudomorphic high electron mobility transistor (PHEMT) connected in an electrically operative circuit, the HEMT or PHEMT having a source, gate and drain port, a shunt feedback circuit connected between the drain and the gate and a series feedback circuit connected between the source and a predetermined reference potential.

The shunt feedback circuit may include variable resistance, such as a plurality of selectable discrete resistances, for obtaining a predetermined value of resistance. Each discrete resistance may include a respective interruptible electrical bypass so that each discrete resistance is selectively includable in the shunt feedback circuit for providing the predetermined resistance. The shunt feedback circuit may include inductance which when the amplifier is implemented as a MMIC is in the form of a U or inverted U.

An amplifier may also include a plurality of serially connected stages, having a first and last stage with each stage including a high electron mobility transistor (HEMT) or pseudomorphic high electron mobility transistor (PHEMT) having a source, gate and drain port, a shunt feedback circuit connected between the drain and the gate and a series feedback circuit connected between the source and a predetermined reference potential.

The gate of the first stage is for receiving an input signal to be amplified, the drain of the last stage is for supplying an amplified original in response to the input signal and the drain of a HEMT or PHEMT is connected to the gate of a HEMT or PHEMT of a next serially connected stage.

The series feedback circuit may include resistance. The shunt feedback circuit may include serially connected capacitance and resistance in the order recited between the drain and gate. The resistance may be tunable such as by selectively including one or more of a plurality of discrete resistances in the shunt feedback circuit.

The features of the invention believed to be novel are set forth with particularity in the appended claims. The invention itself, however, both as to organization and method of operation, together with further objects and advantages thereof, may best be understood by reference to the detailed description taken in connection with the accompanying drawing.

DETAILED DESCRIPTION

Figures 1, 3:
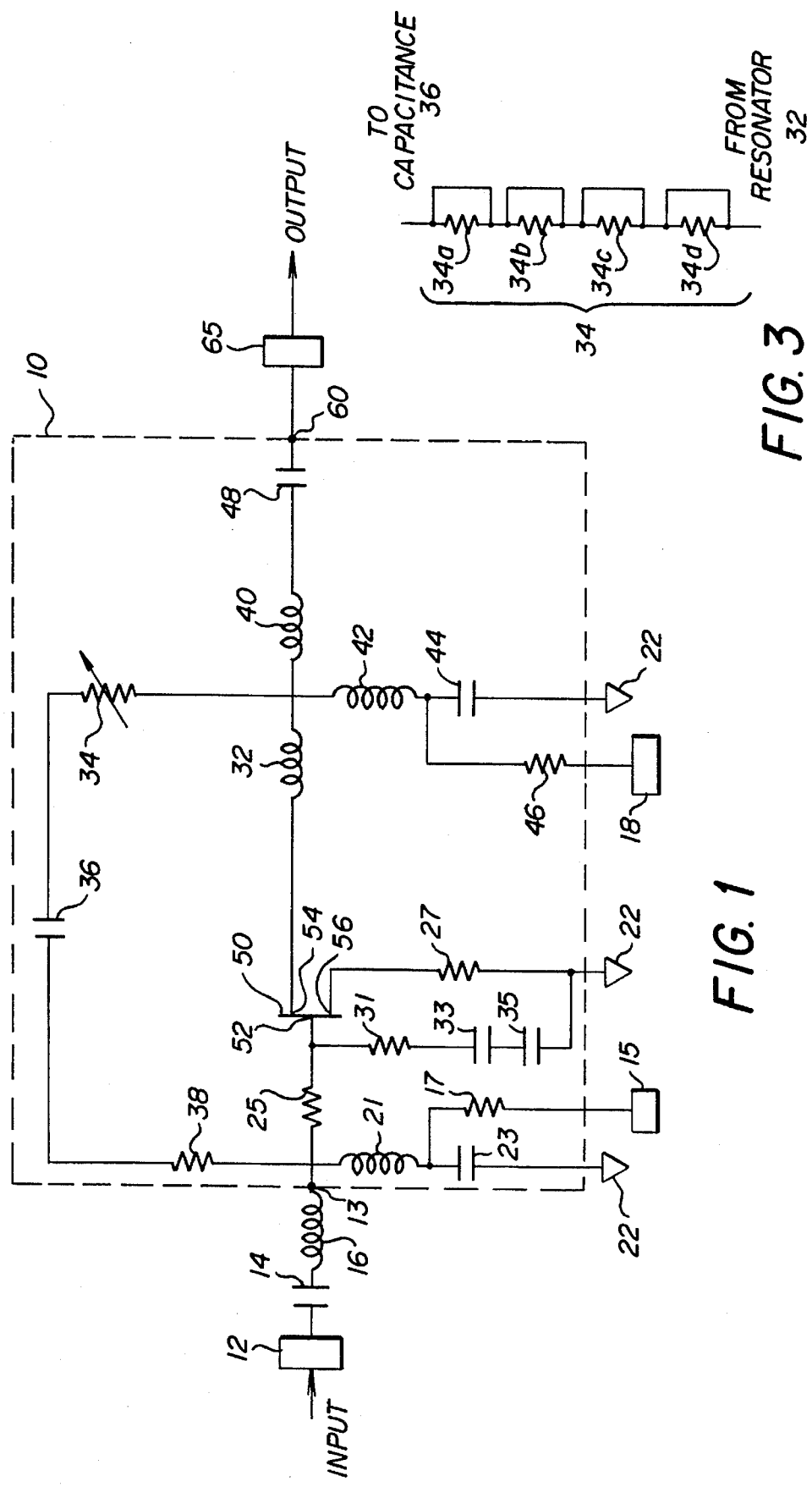
FIG. 1 is a schematic diagram of circuit for a one-stage amplifier in accordance with the present invention.
FIG. 3 is a schematic diagram of a gain trimming circuit of FIG. 1.

Referring to FIG. 1, a schematic diagram of a circuit for a one-stage amplifier in accordance with the present invention is shown. In order to facilitate understanding of the present invention and to assist in identifying circuit components of FIG. 1 with a corresponding implementation component of FIG. 2, the reference numeral indicators for a FIG. 2 component will include the same reference numeral as its corresponding circuit component of FIG. 1 along with the subscript m. Further, it should be noted that circuit components are shown using symbols which typically represent lumped parameters, for example, an inductor for inductance, a capacitor for capacitance and a resistor for resistance. However, one of ordinary skill in the art will readily comprehend that as the frequency at which the circuitry operates increases, such parameters and the effects thereof tend to become more distributed and as such should be taken into account as known by one of ordinary skill in the art when specifying component geometries and the values desired to be associated therewith.

Amplifier 10 is a feed-back amplifier having low power consumption in accordance with the present invention. Port 13, which constitutes the input to amplifier 10, is connected to the junction of respective first terminals of shunt inductance 21 and microwave stabilizing resistance 25 and shunt feedback resistance 38. A second terminal of resistance 25 is connected to a first port 52 (commonly referred to as a "gate") of a high electron mobility transistor (HEMT) or a pseudomorphic high electron mobility transistor (PHEMT) 50.

The junction of resistances 25 and 38 is connected through series connected inductance 21 and shunt capacitance 23 to a reference voltage potential 22 which is typically at ground or chassis potential while bias for gate 52 is injected through bias resistance 17. Bias resistance 17 has one terminal connected to the junction of inductance 21 and capacitance 23. Another terminal of resistance 17 is connected to pad 15 which typically has a negative voltage with respect to ground potential available thereat.

Likewise, the junction of resistance 25 and port 52 of HEMT 50 is connected through series connected microwave stabilizing resistance 31 and capacitances 33 and 35 to reference potential 22. Another or second port 56 (commonly referred to as the "source") of HEMT 50 is connected through series feedback resistance 27 to reference potential 22.

Yet another or third port 54 (commonly referred to as the "drain") of HEMT 50 is connected through series connected inductance, or parasitic removal resonator, 32, inductance 40, such as a spiral inductor, and capacitance 48 to port 60 which constitutes the output of amplifier 10. The junction of resonator 32 and inductance 40 is connected through series connected inductance 42 and capacitance 44 to reference potential 22. The junction of inductance 42 and capacitance 44 is connected to one terminal of resistance 46 while bias is supplied at port 18, such as by establishing port 18 at a voltage potential that is typically less than breakdown voltage. Resonator 32 resonates out the effects of capacitance $C_{dg}$ (drain-to-gate) and $C_{dg}$ (drain-to-gate) for increasing overall gain of amplifier 10.

The ports of a PHEMT are typically designated the same as those of a HEMT and may be arranged and electrically interconnected in a circuit analogously to those of a HEMT.

The junction of resonator 32 and inductance 40 is also connected though series connected variable or tuning resistance 34, capacitance 36 and resistance 38 to the junction of resistance 25 and inductance 21. Thus, a portion of the electrical signal from port 54 of HEMT 50 along the shunt feed-back electrical path through resonator 32, variable resistance 34, capacitance 36, resistance 38 and resistance 25 is supplied to port 52 of HEMT 50.

If desired, amplifier 10 may be employed as one stage of a multi-stage amplifier and may be replicated for each additional stage. In such case, output port 60 would be connected to input port 15 of a next sequentially connected stage. The last of the sequential output stages 10 may have its output port 60 connected to output impedance matching circuitry, typically including inductance and/or capacitance, or directly to other equipment, such as a receiver or transmitter system. Alternatively, the values of inductance 40 and capacitance 48 for the last stage amplifier 10 may be selected to include appropriate output impedance matching for connection to such other equipment.

Input impedance matching circuitry may also be connected to input port 13 of amplifier 10 or to the port 13 of the first stage 10 of a multi-stage amplifier. Representative input impedance matching circuitry is illustrated as serially connected capacitance 14 and inductance 16, such as a spiral inductor, with the terminal of inductance 16 that is not connected directly to capacitance 14 being connected to port 13.

When amplifier 10 is implemented in the form of a monolithic microwave integrated circuit (MMIC), the MMIC may include input and output impedance matching circuitry for amplifier 10 for minimizing spurious and stray electrical effects, maximizing efficiency and increasing gain and stability of amplifier 10, while facilitating connection to other equipment. Also an electrically conductive pad 12 may be connected to the terminal of capacitance 14 that is not connected directly to inductance 16. Likewise port 60 may be connected to electrically conductive pad 65. Pads 12 and 65, which are typically fabricated as part of and disposed toward the periphery of the MMIC, as shown more clearly in FIG. 2, additionally facilitate electrical interconnection from and to, respectively, other electronic equipment and/or devices.

It should be noted that when the circuitry of amplifier 10 is implemented as a MMIC, then variable gain trimming resistance 34 may be fabricated as a plurality of serially connected resistances, four of which are shown schematically in FIG. 3 and designated as resistances 34a, 34b, 34c and 34d. Each of resistances 34a–34d includes a respective shunt bypass 37a–37d electrically connected around it so that it is initially electrically removed from the circuit, or bypassed. A convenient technique is to include an air bridge as a series conductive member in such shunt circuit. Resistances desired to be included in the circuit would then have the corresponding shunt or air bridge physically interrupted, such as by mechanical severing or laser ablation, to open the electrical shunt path and around the resistance.

For example, if shunt 37a around resistance 34a and shunt 37c around resistance 34c were electrically interrupted, then resistance 34 would be represented by the combination of serially connected resistances 34a and 34c. Using this technique, any combination of resistances 34a, 34b, 34c and 34d may be selected to represent resistance 34. Further, all shunts 34a–34d may be left in tact if desired so that resistance 34 is effectively zero. The resistance values for individual resistances 34a–34d which are not necessarily equal to each other may be determined by one of ordinary skill in the art without undue experimentation. Further, the number of resistances which are initially included in the circuit and ultimately selected to represent resistance 34 may be greater or lesser than four.

Figure 2:
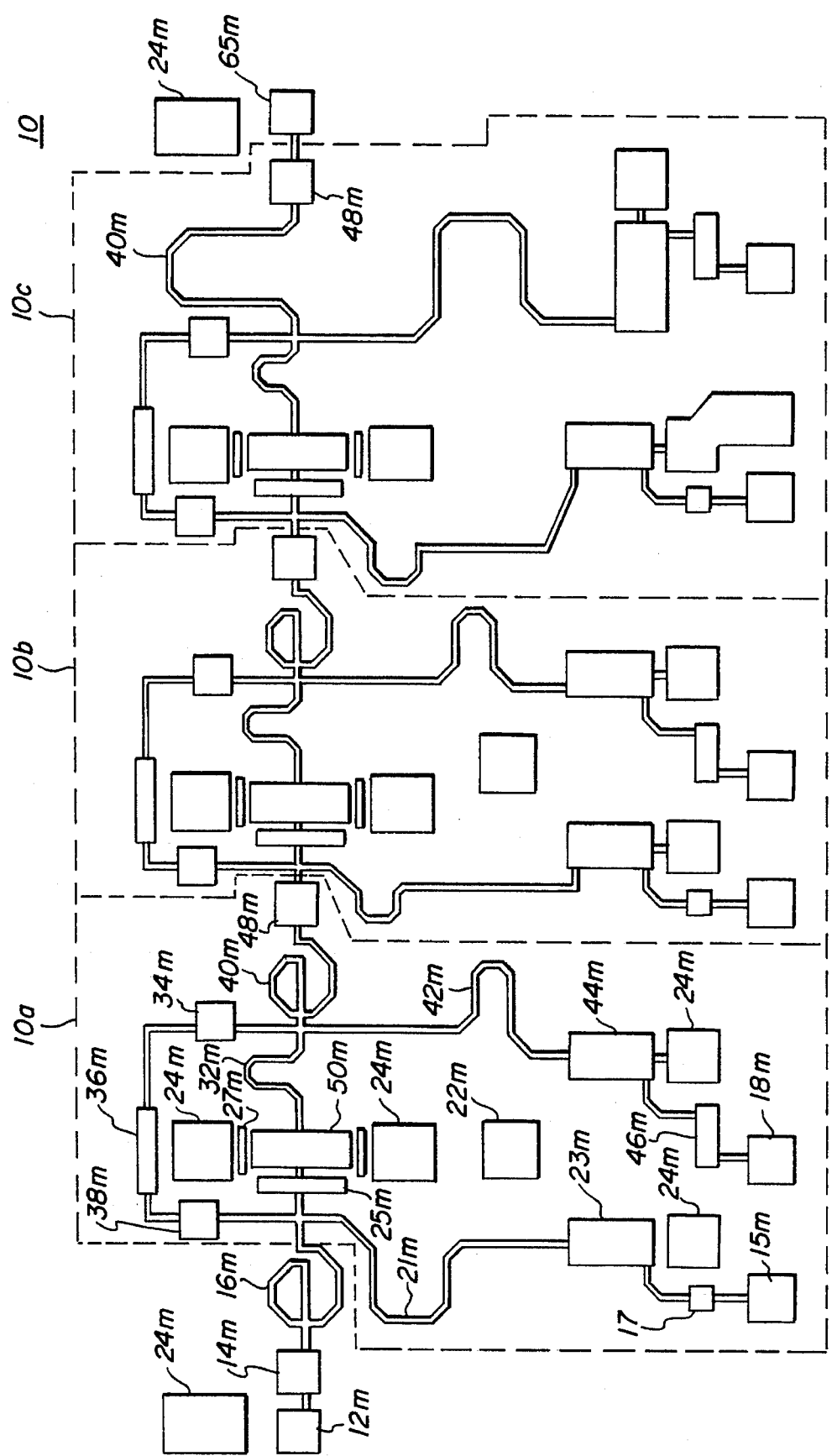
FIG. 2 is a plan view of a part block, part schematic diagram of an implementation, not necessarily to scale, of a three-stage amplifier in the form of a monolithic microwave integrated circuit (MMIC) which includes the circuit of FIG. 1 replicated three times.

Referring to FIG. 2, a plan view of a part block, part schematic diagram of an implementation, not necessarily to scale, of a three-state amplifier in the form of a MMIC, which includes the circuit of FIG. 1 replicated three times, is shown.

Three serially connected stages 10a, 10b and 10c of amplifier 10 are shown as they may be fabricated in a MMIC layout. Only the components of first stage amplifier 10a have been identified in detail with reference numerals to avoid undue clutter. It is noted that whereas inductance 40 m is shown implemented as a spiral inductor in first stage amplifier 10a and in intermediate stage amplifier 10b for last stage amplifier 10c it is implemented as a loop, or inverted U. Resonator 32 is also shown fabricated as a loop or inverted U. Pads 15 and 18 may be used to facilitate electrical connection such as to predetermined reference potential. A plurality of vias 24 m are dispersed over the MMIC for facilitating interconnection between a first or top side having components and circuit elements and a second or backside having a reference or ground plane such as for connecting to predetermined reference potential 22.

For obtaining low power consumption during operation, it is most desirable that amplifier 10 have an essentially flat gain response or characteristic over the desired operating bandwidth. Amplifier 10 may be used over an input signal frequency range from about 9 GHz to about 14 GHz, with operation from about 11 GHz to about 13 GHz being preferred and operation from 11.7 GHz to 12.2 GHz being most preferred.

MESFET based amplifiers have been used in the past. However, for operating frequencies above higher X-band frequencies, that is, above about 11 GHz, MESFET devices do not generally exhibit enough individual device gain. Therefore, addition of one or more MESFET-based stages does not significantly increase overall amplifier gain, while it does significantly increase overall amplifier power consumption.

Because the processing of HEMT and PHEMT active elements is relatively new, especially with respect to that for MESFETs, electrical characteristics for individual HEMT and PHEMT devices tend to experience wider fluctuations in relevant electrical characteristics than do MESFET devices. By using HEMT and/or PHEMT devices in the configuration of an amplifier in accordance with the present invention, electrical characteristic variation of the HEMT and PHEMT, and especially that of the capacitance and transconductance thereof, is minimized and the ultimate electrical performance of such amplifiers can be made to be essentially insensitive to the process used to fabricate the active amplifier elements.

In addition, a HEMT or PHEMT generally has a higher gain than a MESFET over the corresponding frequency of operation, and especially in the upper portion of and above X-band, so that a relatively fewer number of amplifier stages 10 may be cascaded for obtaining the same or greater overall amplifier gain.

HEMT and PHEMT devices may be used as the active element for different stages of an amplifier in accordance with the present invention. That is, one or more stages may include a respective HEMT, while the remaining stages may include a respective PHEMT, as the active element devices. Of course, all stages may be homogenous in that they all use the same type of device as the active element.

The values for specific circuit elements of resistance, capacitance and inductance of amplifier 10 may be determined by one ordinary skill in the art without undue experimentation. For example, one skilled in the art of circuit implementation in a MMIC format will recognize that the geometry of a circuit element is an important consideration for determining component value when the desired operating frequency is in the X-band and above.

While only certain preferred features of the invention have been shown by way of illustration, many modifications and changes will occur to those skilled in the art. It is to be understood that the appended claims are intended to cover all such modifications and changes as fall within the true spirit and scope of the invention.

What is claimed is:

1. An amplifier comprising:
   a high electron mobility transistor (HEMT), the HEMT having a first port, a second port and a third port, the second port for receiving an input signal for controlling electron flow between the first and third port, the third port for supplying an output signal in response to the input signal;
   a shunt feedback circuit connected between the third port and the second port; and
   a series feedback circuit connected between the first port and a predetermined reference potential,
   wherein the shunt feedback circuit includes variable resistance and inductance, the variable resistance for obtaining a predetermined value of resistance, and further wherein the amplifier is implemented as a monolithic microwave integrated circuit (MMIC) and the inductance is a resonator in the form of a U.

2. The amplifier as in claim 1, wherein the variable resistance includes a plurality of discrete resistances, the discrete resistances further including a respective interruptible electrical bypass so that each discrete resistance is selectively includable in the shunt feedback circuit for providing the predetermined resistance.

3. An amplifier comprising:
   a pseudomorphic high electron mobility transistor (PHEMT), the PHEMT having a first port, a second port and a third port, the second port for receiving an input signal for controlling electron flow between the first and third port, the third port for supplying an output signal in response to the input signal;
   a shunt feedback circuit connected between the third port and the second port; and
   a series feedback circuit connected between the first port and a predetermined reference potential,
   wherein the shunt feedback circuit includes variable resistance and inductance, the variable resistance for obtaining a predetermined value of resistance, and further wherein the amplifier is implemented as a monolithic microwave integrated circuit (MMIC) and the inductance is a resonator in the form of a U.

4. The amplifier as in claim 3, wherein the variable resistance includes a plurality of discrete resistances, the discrete resistances further including a respective interruptible electrical bypass so that each discrete resistance is selectively includable in the shunt feedback circuit for providing the predetermined resistance.

5. An amplifier comprising:
   a plurality of serially connected stages having a first and last stage, each stage including:

a high electron mobility transistor (HEMT), having a first port (source), a second port (gate) and a third port (drain);

a shunt feedback circuit connected between the third port and the second port; and a series feedback circuit connected between the first port and a predetermined reference potential, wherein the second port of the first stage for receiving an input signal to be amplified, the third port of the last stage for supplying an amplified signal in response to the input signal, and the third port of the HEMT of each stage other than the last stage connected to the second port of the HEMT of a next serially connected stage.

6. The amplifier as in claim 5, wherein the series feedback circuit includes resistance.

7. The amplifier as in claim 5, wherein the shunt feedback circuit includes serially connected capacitance and resistance in the order recited between the third port and the second port.

8. The amplifier as in claim 7, further including tunable resistance serially connected between the third port and the capacitance.

9. The amplifier as in claim 8, wherein the tunable resistance includes a plurality of resistors, each of the resistors including a physically interruptible shunt so that when the shunt is interrupted the corresponding resistor is electrically included in the shunt feedback circuit.

10. An amplifier comprising:

a plurality of serially connected stages having a first and last stage, each stage including:

a pseudomorphic high electron mobility transistor (PHEMT), having a first port (source), a second port (gate) and a third port (drain);

a shunt feedback circuit connected between the third port and the second port; and a series feedback circuit connected between the first port and a predetermined reference potential, wherein the second port of the first stage for receiving an input signal to be amplified, the third port of the last stage for supplying an amplified signal in response to the input signal, and the third port of the PHEMT of each stage other than the last stage connected to the second port of the PHEMT of a next serially connected stage.

11. The amplifier as in claim 10, wherein the series feedback circuit includes resistance.

12. The amplifier as in claim 10, wherein the shunt feedback circuit includes serially connected capacitance and resistance in the order recited between the third port and the second port.

13. The amplifier as in claim 12, further including tunable resistance serially connected between the third port and the capacitance.

14. The amplifier as in claim 13, wherein the tunable resistance includes a plurality of resistors, each of the resistors including a physically interruptible shunt so that when the shunt is interrupted the corresponding resistor is electrically included in the shunt feedback circuit.

* * * * *